(12) United States Patent
Chan et al.

(10) Patent No.: US 6,580,132 B1
(45) Date of Patent: Jun. 17, 2003

(54) DAMASCENE DOUBLE-GATE FET

(75) Inventors: Kevin K. Chan, Staten Island, NY (US); Erin C. Jones, Tuckahoe, NY (US); Paul M. Solomon, Yorktown Heights, NY (US); Hon-Sum Phillip Wong, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/119,799

(22) Filed: Apr. 10, 2002

(65) Prior Publication Data (65)

(51) Int. Cl.[7] ................................................ H01L 29/76
(52) U.S. Cl. ...................... 257/365; 257/347; 438/233; 438/164
(58) Field of Search ................... 257/300, 365, 257/366, 401, 347, 348, 192, 396, 63, 65, 327, 616; 438/229, 199, 223, 230, 704, 164, 233

(56) References Cited

U.S. PATENT DOCUMENTS

| | | | | |
|---|---|---|---|---|
| 5,349,228 A | * | 9/1994 | Neudeck et al. ............ | 257/365 |
| 5,413,948 A | * | 5/1995 | Pfiester et al. .......... | 257/365 X |
| 5,461,250 A | * | 10/1995 | Burghartz et al. .......... | 257/347 |
| 5,646,058 A | * | 7/1997 | Taur et al. .............. | 257/365 X |
| 5,773,331 A | | 6/1998 | Solomon et al. | |
| 6,300,184 B1 | * | 10/2001 | Choi et al. .................. | 438/223 |
| 6,486,067 B1 | * | 11/2002 | Shen et al. ................. | 438/704 |

OTHER PUBLICATIONS

Frank et al., Generalized scale length for two-dimensional effects in MOSFETs, IEEE Electron Device Letters, vol.: 19 Issue: 10, Oct. 1998, pp.: 385–387.*

* cited by examiner

Primary Examiner—Wael Fahmy
Assistant Examiner—(Vikki) Hoa B. Trinh
(74) Attorney, Agent, or Firm—Scully, Scott, Murphy & Presser; Kevin M. Jordan

(57) ABSTRACT

A double-gate field effect transistor (DGFET) is provided using a damascene-like replacement gate processing step to create sidewall source/drain regions, oxide spacers and gate structures inside a previously formed trench. The damascene-like replacement gate processing step allows for the fabrication of a tapered transistor body region having a thicker body under the contacts which reduces access resistance.

10 Claims, 16 Drawing Sheets

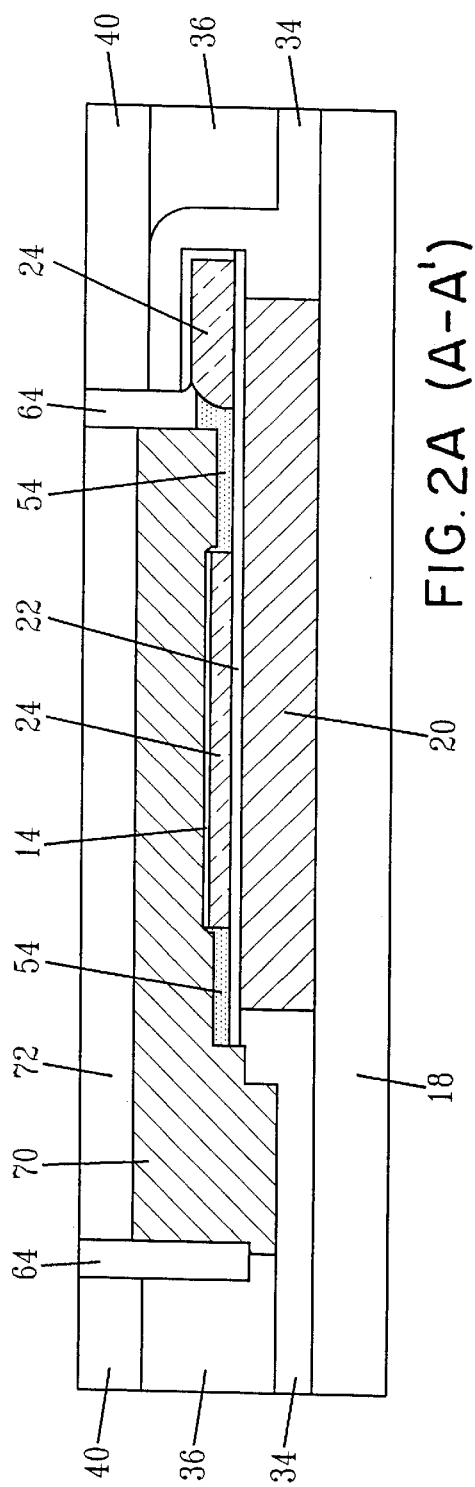
FIG.2A (A-A')
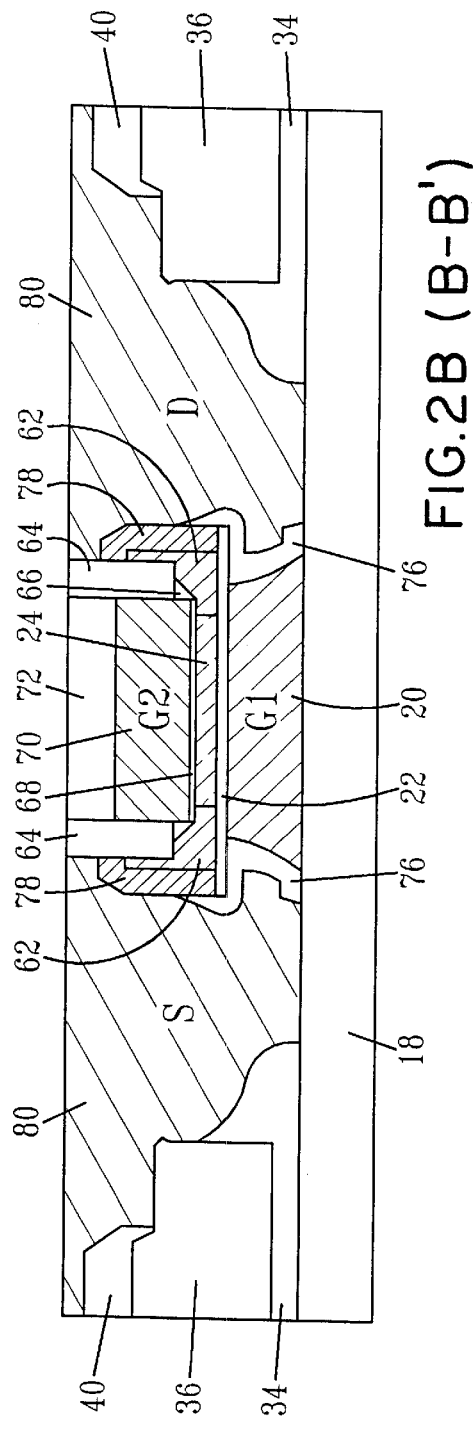
FIG.2B (B-B')

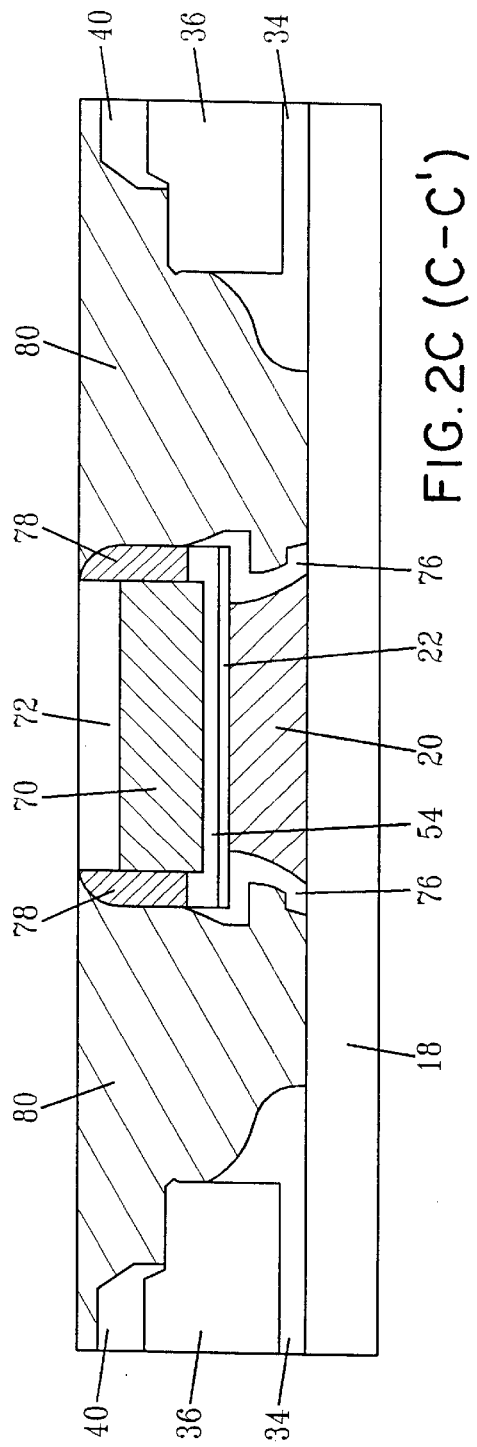
FIG. 2C (C-C')
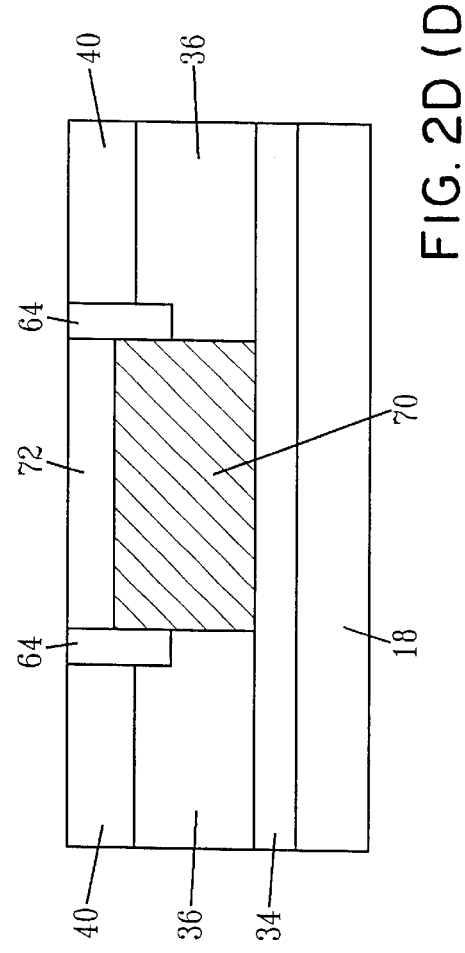
FIG. 2D (D-D')

DAMASCENE DOUBLE-GATE FET

This application was sponsored by the United States Government under Contract No. N66001-97-1-8908, which was awarded by DARPA (Department of Advanced Research Projects Agency); therefore, the United States Government has certain rights and privileges to the present application.

FIELD OF THE INVENTION

The present invention relates to double-gated field effect transistors (FETs), and in particular to a process of fabricating double-gated FETs wherein a damascene-like replacement gate processing step is employed to create sidewall source/drain regions, oxide spacers and gate structures inside a previously formed trench.

BACKGROUND OF THE INVENTION

In order to make integrated circuits (ICs) such as memory, logic and other devices, of higher integration density than currently feasible, one has to find a means to further scale down the FET devices that are present therein. Moreover, as FET dimensions are scaled down, it becomes increasingly difficult to control short-channel effects by conventional means. Short-channel effects, as well known to those skilled in the art, are the decrease in threshold voltage, $V_t$, in short-channel devices, i.e., sub-0.1 micron, due to two-dimensional electrostatic charge sharing between the gate and the source/drain regions.

An evolution beyond the standard single gate metal oxide semiconductor field effect transistor (MOSFET) is the double-gate MOSFET, where the device channel is confined between top and bottom gate dielectric layers. This structure, with a symmetrical gate structure, can be scaled to about half of the channel length as compared to a conventional single gate MOSFET structure. It is well known that a dual gate or double gate MOSFET device has several advantages over conventional single gate MOSFET devices. Specifically, the advantages for dual gate MOSFET devices over their single gate counterparts include: a higher transconductance, lower parasitic capacitance, and improved short-channel effects. For instance, Monte-Carlo simulation has been previously carried out on a 30 nm channel dual gate MOSFET device and has shown that the dual gate device has a very high transconductance (2300 mS/mm) and fast switching speeds (1.1 ps for nMOSFET).

Moreover, improved short-channel characteristics are obtained down to 20 nm channel length with no doping needed in the channel region. This circumvents all the tunneling breakdown, dopant quantization, and dopant depletion problems associated with channel doping that are normally present with single gate MOSFET devices. Some examples of prior art double-gate MOSFETs are found in the following references:

U.S. Pat. No. 5,188,973 describes a double-gate structure in which the bottom gate is not self-aligned to the top gate. This prior art double-gate structure is quite different from the double-gate structure described herein in that the inventive double-gate structure contains self-aligned bottom and top gates. Moreover, the process and design philosophy is very different from the one presented hereinbelow.

U.S. Pat. No. 5,140,391 describes another double-gate structure. In this prior art double-gate structure, no sidewall source and drain regions are disclosed. Moreover, in the '391 patent, the bottom gate of the transistor is patterned before the channel region is grown and the disclosed transistor does not contain self-aligned top and bottom gates.

U.S. Pat. No. 5,349,228 describes another double-gate structure in which no sidewall source/drain regions are disclosed. Additionally, in the '228 patent, the bottom gate has to be oxidized. The use of such oxidation greatly limits the choice of bottom gate materials. Furthermore, in the '228 patent, the bottom gate oxide has to be formed before the channel which precludes the use of high-quality grown silicon/silicon dioxide interfaces from the bottom oxide.

To date, prior art methods for fabricating double-gate MOSFETs have either been very complex or have severe drawbacks in terms of parameter control. Moreover, some of the structures known in the art have large parasitic capacitance to the bottom gate.

Co-assigned U.S. Pat. No. 5,773,331 describes a structure and method for fabricating a double-gate MOSFET structure in which the above problems have been solved. In particular, the '331 patent describes a double-gate MOSFET having sidewall source and drain contacts and bottom and top gate oxides that are self-aligned. The structure disclosed in the '331 patent has low parasitic capacitance to the bottom gate and a reduced drain and source resistance as compared to other prior art double-gate MOSFETs.

In the '331 patent, the double-gate MOSFET having the above-mentioned characteristics is obtained by the steps of: forming a channel layer; forming a top gate insulator layer on said channel layer; forming a top gate on said top gate insulator; forming a gate pillar on the top gate; forming insulating sidewall layers adjacent to said top gate and said gate pillar; forming an integral source/drain region within said channel layer by introduction of dopants; forming conductive amorphous sidewalls on either side of, and adjacent to said insulating sidewall layers, one of said amorphous silicon sidewalls being connected to said drain region and one being connected to said source region; and etching said channel layer using said top gate, gate pillar, insulating sidewall layers and amorphous silicon sidewalls as a mask, thereby transferring the lateral extension of said mask into said channel layer, providing for a channel with integral source/drain regions being raised with respect to the support structure The present application provides an alternative means for fabricating a double-gate MOSFET structure having properties that are essentially the same as those disclosed in the '331 patent.

SUMMARY OF THE INVENTION

One object of the present invention is to provide a process of fabricating a dense double-gated field effect transistor (FET) wherein the gate length of the transistor is much smaller than the lithographic line.

Another object of the present invention is to provide a process of fabricating a double-gated FET having an inside-out geometry which enables the formation of a tapered body region with a thicker body under the contacts thereby reducing access resistance.

A further object of the present invention is to provide a process of fabricating a double-gated FET in which threshold voltage roll-off has been essentially reduced.

A still further object of the present invention is to provide a process of fabricating a double-gated FET which is compatible with current IC fabrication techniques.

An even further object of the present invention is to provide a process of fabricating a double-gated FET having low-parasitic capacitance to the bottom gate and a reduced source and drain resistance.

A still even further object of the present invention is to provide a process of fabricating a double-gated FET where the bottom and top gates are self-aligned.

These and other objects and advantages are achieved in the present invention by utilizing a damascene-like replacement gate process to create sidewall source/drain regions, oxide spacers and a gate structure in a previously formed trench. Multiple chemical-mechanical polishing (CMP) steps are also employed in the inventive process to square off the top of the structure at various stages of its fabrication. In accordance with the present invention, the top gate of the double-gated FET is built inside a top gate trench which contains source/drain regions and oxide spacers formed therein.

This achieves the following advantages:
(i) The inside-out geometry enables one to form a tapered body region with a thicker body under the contacts to reduce access resistance.
(ii) Since lithography defines the largest dimension, the top gate length may be much smaller than the minimum lithographic feature.
(iii) The bottom gate is referenced to the lithographic top gate stencil, resulting in better line width control.
(iv) The inventive structure has an inverted geometry with tapered sides facing one of the gates.

Specifically, the process of the present invention, which is capable of forming a doublegate FET having sidewall source and drain regions as well as sidewall silicide contacts, comprises the steps of:

providing a pad stack to a structure which comprises a Si layer present atop a backgate material stack whose bottom surface is bonded to a surface of a handle wafer, said backgate material stack includes a bottom insulator, a bottom gate electrode and a bottom gate dielectric;

forming an opening through said pad stack which extends to the bottom insulator to expose sidewalls of said Si layer and said bottom gate electrode;

protecting the exposed sidewalls of said Si layer and recessing exposed sidewall portions of said bottom gate electrode;

planarizing the structure and forming a material stack having a top gate trench opening therein;

forming sidewall source and drain regions on exposed sidewalls of said top gate trench; forming a top gate between said sidewall source and drain regions, said top gate being protected with a top gate protect insulator;

etching source and drain wells, self-aligned to said top gate and said sidewall source and drain regions;

forming source and drain well implants regions in preselective portions of the structure;

etching said bottom gate through said source and drain wells so as to be self-aligned to sidewall source and drain structures and hence to the top gate;

protecting exposed sidewalls of said bottom gate; and forming source and drain contacts and contact plugs.

In addition to the above processing steps, the present invention also provides a novel double-gated FET structure which has an inside-out geometry that enables one to form a tapered body region with a thicker body under contacts to reduce access resistance. Specifically, the inventive double-gated FET comprises:

a top gate and a bottom gate which are separated by two gate dielectric layers which are sandwiched between a device channel region, said top and bottom gates are self-aligned with each other;

sidewall source and drain regions that are located in regions that are adjacent and between said top and bottom gates;

silicide gate contacts which are in electrical contact with said top and bottom gates and are located adjacent to said source and drain regions; and source and drain wells that are located in regions abutting the silicide gate contacts.

BRIEF DESCRIPTION OF THE DRAWINGS

FIGS. 2A–2D are cross-sectional representations of the inventive FET structure through various cuts shown in FIGS. 1A–1B.

DETAILED DESCRIPTION OF THE INVENTION

Figure 1A:
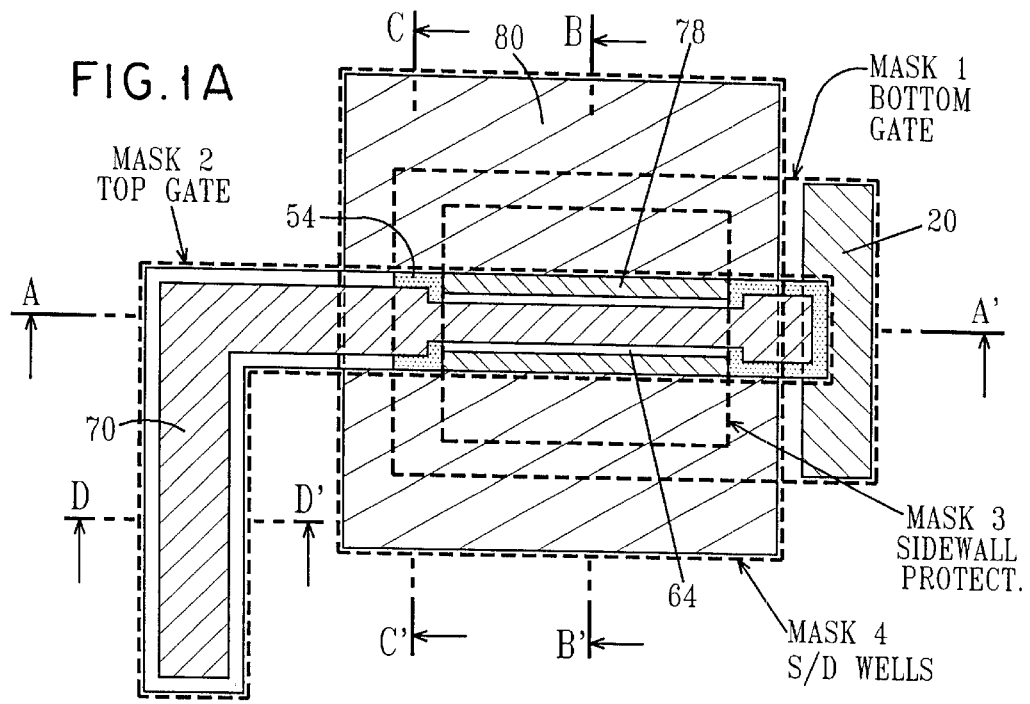
FIGS. 1A–1B are pictorial representations of a plan view of the inventive FET structure and mask layout; 1A completed structure up to first-level metal, excluding gate contacts; 1B cut-away view showing where the silicon channel layer remains after etching and oxidization.

The present invention, which provides a damascene-like gate replacement process of fabricating a double-gated field effect transistor (DGFET), will now be described in more detail by referring to the drawings that accompany the present application.

Specifically, FIGS. 1 and 2 are top-down and sectional views, respectively of the DGFET of the present invention, while FIGS. 3–24 are representations of the structure through various processing steps of the present invention.

Figure 1B:
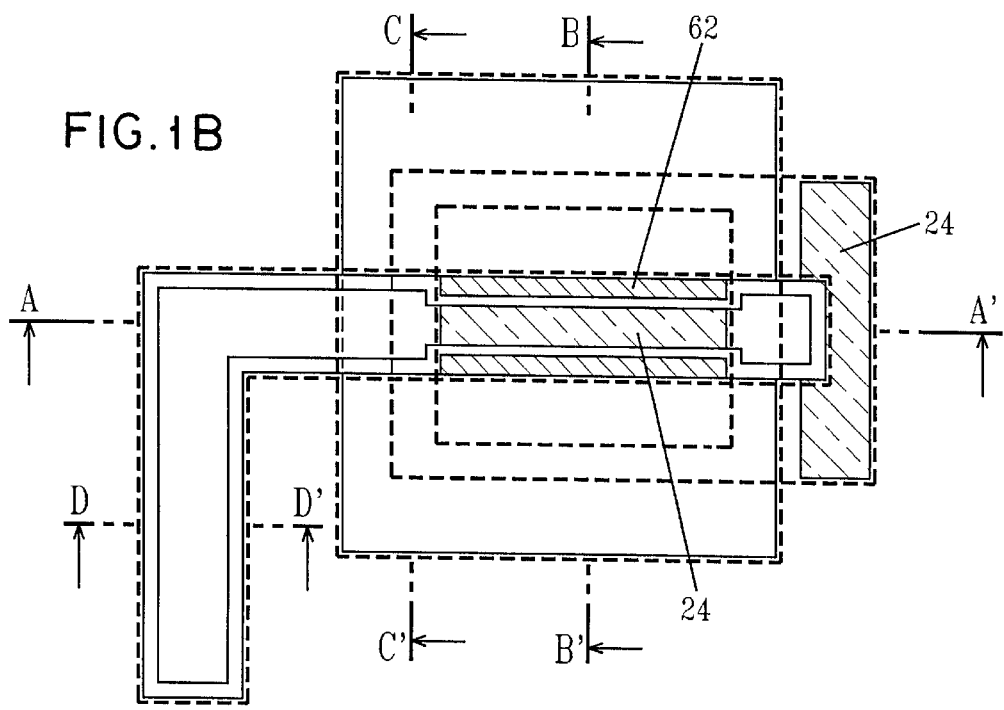

Reference is first made to FIGS. 1A and 1B which is a plan view of the inventive FET structure and mask lay-out. FIG. 1A is the completed structure up to first-level metal, excluding gate contacts, whereas FIG. 1B is a cut-away view showing where the silicon channel layer remains in the structure after etching and oxidation. Note cut A–A' is a cross-section though the top and bottom gate regions; cut B–B' is a cross-section through an active area between the top and bottom gates, cut C–C' is a cross-sectional view through an area adjacent to the top gate; and cut D–D' is a cross-sectional view through the top gate only.

Specifically, FIG. 1A incudes mask 1 which is used in the present invention in forming the bottom gate of the double-gated FET device, mask 2 which is used in forming the top gate of the inventive double-gated FET device, mask 3 which is used in forming the sidewall protect region of the inventive double-gated FET device, and mask 4 which is used in forming the source/drain wells of the inventive double-gated FET device. In FIG. 1A, reference numeral 20 denotes the backgate (i.e., bottom gate) not hidden by the front gate (i.e., top gate), 70 denotes the top gate, 78 denotes the source/drain contacts, and 54 denotes the oxygen implant to remove channel silicon 24. FIG. 1B is a cut-way view showing wherein the silicon channel region 24 remains after etching and oxidation. FIGS. 1A–1B also include silicide contacts 78, tungsten plug 80, oxide spacers 64, and silicon source/drain regions 62.

The completed structure of the present invention is shown in FIGS. 2A–D. Specifically, the inventive structure includes top gate 70 and bottom gate 20 which are separated from each other by gate dielectrics 22 and 68, respectively, and Si channel region 24. Note that in the inventive structure the top and bottom gates are self-aligned. The inventive structure also includes sidewall source and drain regions 62 which are formed in regions adjacent to and between the top and bottom gates. The inventive structure also includes silicide source and drain contacts 78 which are formed in regions adjacent to the source and drain regions. The inventive structure also includes tungsten filled source and drain well regions 80 which are formed in areas adjacent to the source/drain regions and contact silicide regions 78. The various other elements of the inventive double-gated FET will be described in more detail hereinbelow. It is noted that in FIGS. 2A–D, A denotes cut A–A' within the top gate trench, B denotes cut B–B', C denotes cut C–C' and D denotes cut D–D'.

The process of forming the inventive double-gated FET illustrated above in FIGS. 1A–B and FIGS. 2A–D will now be described in more detail by referring to FIGS. 3–24. It is noted that in these drawings, A denotes cut A–A' within the top gate trench, B denotes cut B–B', C denotes cut C–C' and D denotes cut D–D'.

Figure 3:
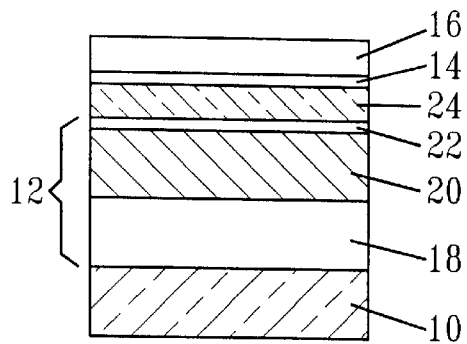
FIGS. 3–24 are cross-sectional representations of the inventive FET structure through various processing steps.

Reference is first made to FIG. 3 (cut through A–A') which illustrates a cross-sectional view of the initial structure of the present invention. Specifically, the initial structure shown in FIG. 3 comprises handle wafer 10, bottom insulator 18, bottom gate electrode 20, bottom gate dielectric 22, Si layer 24, pad oxide layer 14 and nitride layer 16. Note that layers 18, 20 and 22 form backgate material stack 12 of the structure illustrated in FIG. 3.

The structure illustrated in FIG. 3 is fabricated by first forming backgate dielectric material stack 12 on Si layer 24 which is part of a transfer wafer (not shown). After the backgate dielectric material stack 12 is formed on Si layer 24, the exposed surface of bottom insulator 18 is then bonded to handle wafer 10 using conventional bonding processes well known to those skilled in the art. After bonding, portions of the transfer wafer are removed leaving behind Si layer 24.

The transfer wafer employed at this point of the present invention may be a bulk Si wafer, or alternatively, the transfer wafer may be a silicon-on-insulator (SOI) substrate where the buried oxide layer may serve as an etch stop layer. Si layer 24, which forms the body of the inventive FET, is formed by thinning the transfer wafer from the backside after bonding. The thinning process may be achieved by grinding and etching down to an etch stop in the transfer wafer or it may be achieved by splitting off using a separate release layer similar to the SOITEC smartcut process. After thinning, pad oxide is formed on the exposed surface of Si layer 24 (opposite that of bottom gate dielectric 22) and thereafter nitride layer 16 is formed on the pad oxide. Note that layers 14 and 16 are referred to herein as a pad stack.

The backgate material stack is formed utilizing conventional processes well known to those skilled in the art. For example, bottom insulator 18, which may include an oxide, nitride, oxynitride or any combination thereof including multilayers, may be formed by a conventional thermal growing process or it may be formed by a conventional deposition process such as chemical vapor deposition (CVD), plasma-assisted CVD, sputtering, chemical solution deposition and other like deposition processes. In a highly preferred embodiment of the present invention, bottom insulator 18 is composed of an oxide. The thickness of the bottom insulator may vary and is not critical to the present invention. Typically, however, the bottom insulator layer has a thickness of from about 50 to about 200 nm. The bottom gate electrode, which may include silicon, i.e., polysilicon, tungsten, ruthenium and other like conductive materials, is formed on the surface of the bottom insulator utilizing a conventional deposition process such as CVD, plasma-assisted CVD, sputtering, plating (electro or electroless), and chemical solution deposition. A highly preferred material for bottom gate electrode 20 is tungsten. The thickness of the bottom gate electrode may also vary, but typically the bottom gate electrode has a thickness of from about 10 to about 30 nm.

The gate dielectric, which may include an oxide, oxynitride, nitride, high-dielectric constant dielectric (on the order of greater than 7), or combinations, including multilayers thereof is formed utilizing a conventional thermal growing process or, alternatively, a conventional deposition process may be used in forming the same. The gate dielectric employed in the present invention for the bottom gate electrode is typically a thin layer, which has a thickness of from about 1.5 to about 5 nm. Silicon layer 24, after thinning, has a thickness of from about 3 to about 20 nm.

As stated above, pad oxide layer 14 is formed on an exposed surface of thinned Si layer 24 using a thermal growing process or a conventional deposition process. The thickness of the pad oxide layer employed in the present invention may vary, but typically the thickness of the pad oxide layer is from about 1.5 to about 5 nm. Nitride layer 16 which serves as a hard mask 16 is then formed on the surface of the pad oxide layer utilizing a conventional deposition process such as CVD. The thickness of the nitride hard mask is not critical to the present invention, but typically nitride hard mask 16 has a thickness of from about 5 to about 20 nm.

Figure 4:
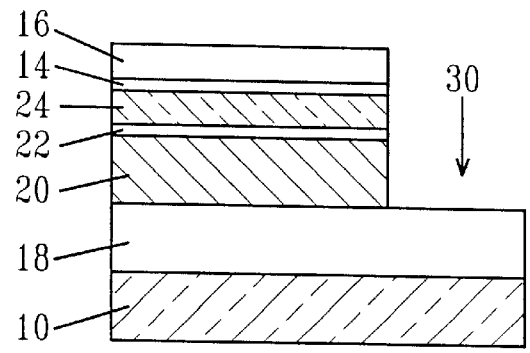

After forming the structure shown in FIG. 3 (through cut A–A'), the backgate region is delineated by utilizing conventional lithography and etching so as to provide the structure shown in FIG. 4 (through A–A'). Specifically, the backgate region is formed as follows: First, a conventional photoresist (not shown in the drawings) is applied to the surface of nitride hard mask 16 utilizing a conventional deposition process including CVD and spin-on coating, and thereafter conventional lithography (including exposure and development) is employed in patterning the photoresist. With the patterned resist initially in place, an etching process such as reactive-ion etching (RIE), ion beam etching, or plasma etching is employed to remove exposed portions of the nitride hard mask, pad oxide, and some of the layers of the backgate material stack, stopping on an upper surface of bottom insulator 18. Thus, this etching step forms first opening 30 in the structure that stops on the bottom insulator.

Figure 5:
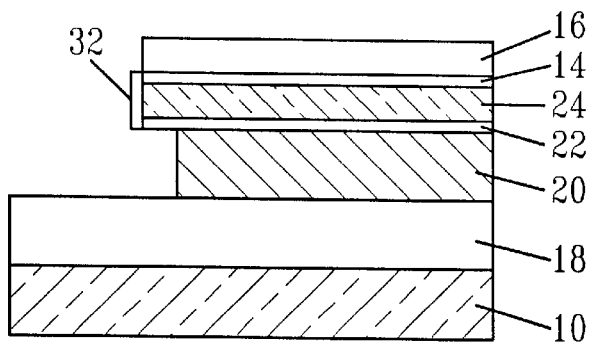

After providing the first opening in the backgate material stack, oxide 32 is thermally grown on silicon layer 24 so as to passivate the end of the Si layer and, thereafter bottom gate electrode 20 is recessed utilizing etching process such as RIE providing the structure shown, for example, in FIG. 5 (through A–A').

Figure 6:
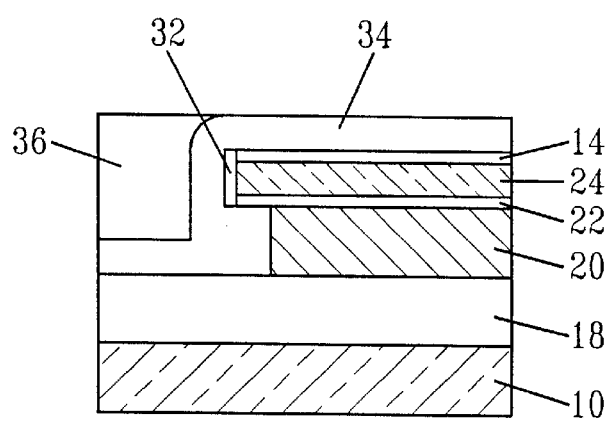

The next steps of the present invention which are also used in delineating the backgate region are shown in FIG. 6 (through A–A'). This includes removal of nitride hard mask 16, forming first planarization stop layer 34 on all surfaces of the structure, forming field oxide layer 36 on said first planarization stop layer and planarizing the field oxide layer down to the upper surface of first planarization stop layer 34. Note, that these steps of the present invention fill the first opening that was previously formed in the backgate material stack with an etch stop material and a field oxide.

Specifically, the nitride hard mask is removed utilizing a conventional stripping process and the first planarization stop layer, which may be composed of a nitride, is formed on all surfaces utilizing a conventional deposition process. The thickness of the first planarization stop layer is not critical to the present invention, but typically, the first planarization stop layer has a thickness of from about 5 to about 20 nm. After depositing the first planarization stop layer, the field oxide layer is formed by a conventional deposition process such as CVD so as to provide an oxide layer having a thickness of from about 10 to about 50 nm. The structure is then subjected to a conventional planarization process so as to remove any field oxide the may be present above the uppermost surface of the first etch stop layer. It is noted that in FIGS. 3–6, handling wafer 10 was shown to be present in the drawings of the present invention. In the remaining drawings, the handling wafer has been omitted for clarity.

Figure 7A:
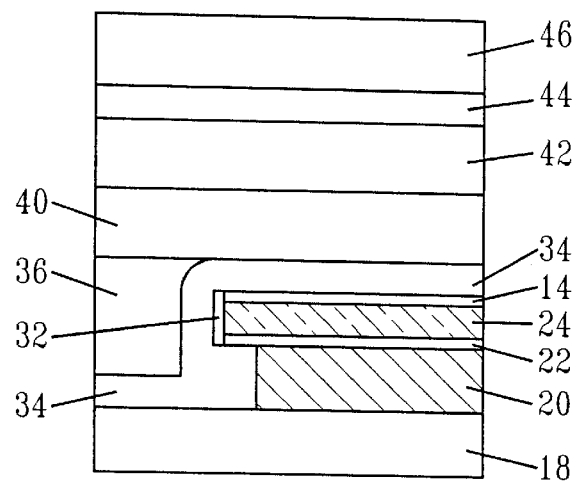
Figure 7B:
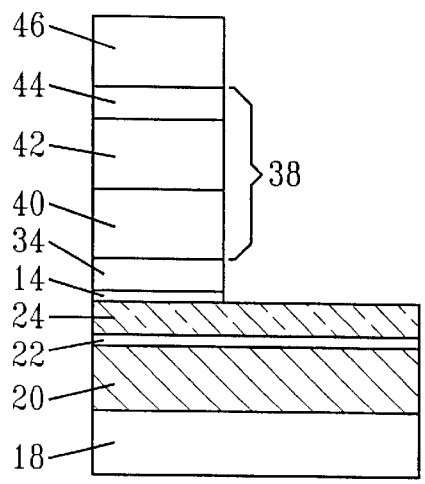
Figure 7C:
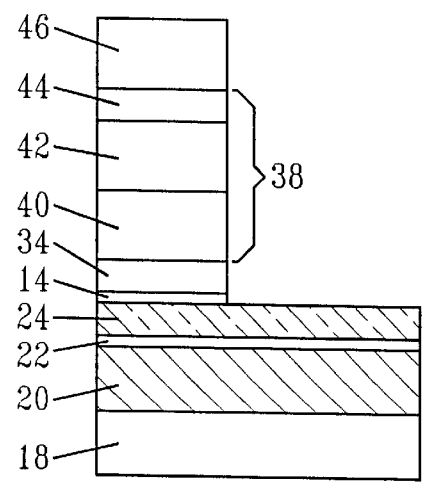
Figure 7D:
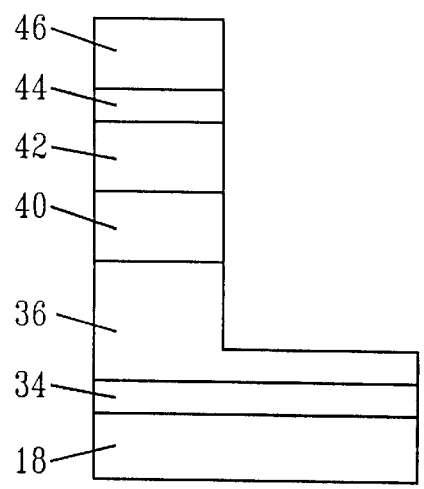
Figure 8A:
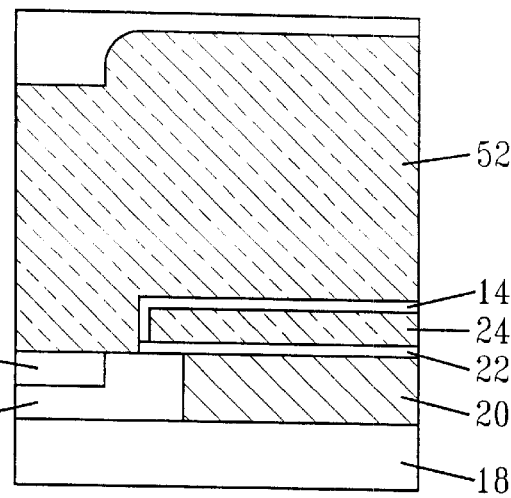
Figure 8B:
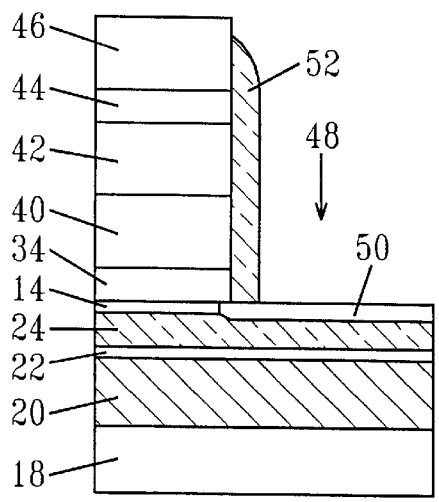
Figure 8C:
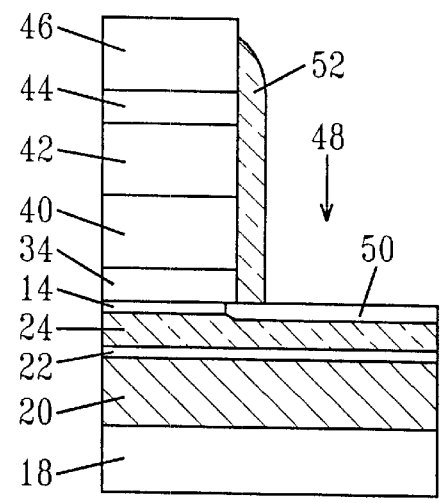
Figure 8D:
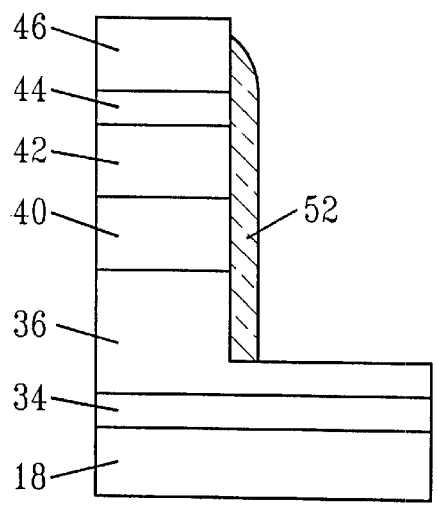
Figure 9A:
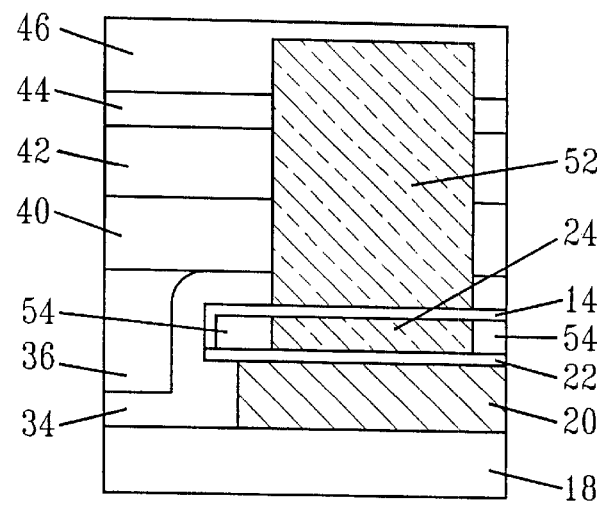
Figure 9B:
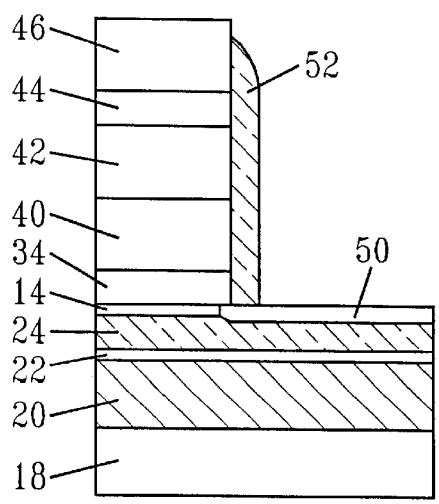
Figure 9C:
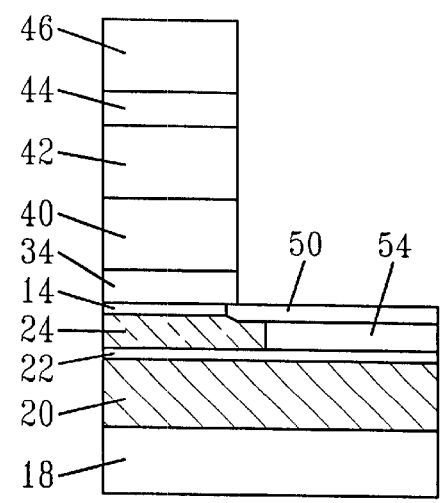
Figure 9D:
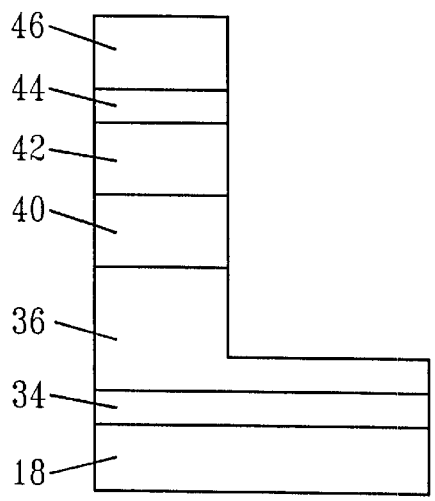
Figure 10A:
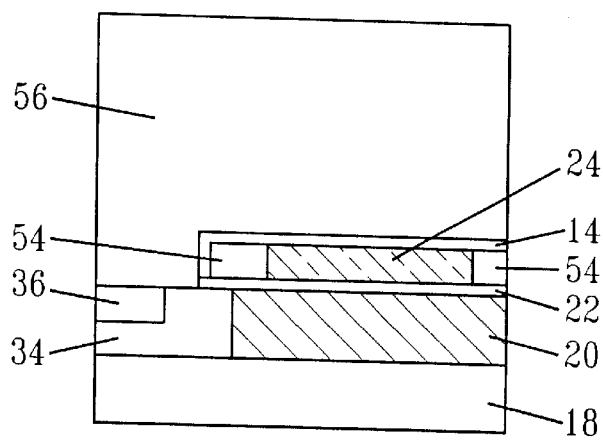
Figure 10B:
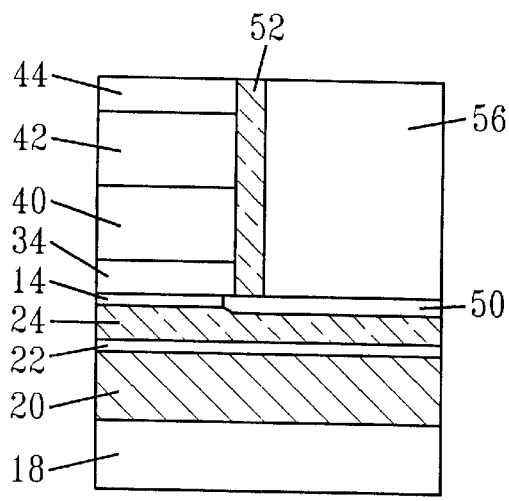
Figure 10C:
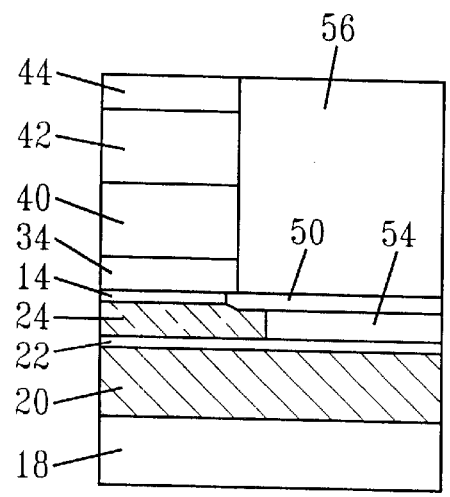
Figure 10D:
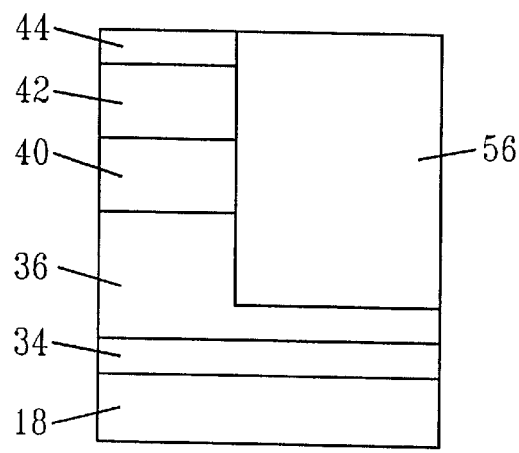

Reference is now made to FIGS. 7A–D and FIGS. 8A–D that illustrate the processing steps used in the present invention in forming the top gate electrode of the double-gated FET device. Note that FIGS. 7B and 7C show identical structures, and that FIGS. 8B and 8C also show similar structure. Specifically, to the planarization structure shown in FIG. 6, material stack 38 comprising second planarization stop layer 40, first sacrificial spacer 42, third planarization stop layer 44 and second sacrificial spacer 46 is formed. The second and third etch stop layers may be formed of the same material as the first planarization stop layer, i.e., a nitride, and the first and second sacrificial spacers are both formed of an oxide. Conventional deposition processes are employed in forming each layer of material stack 38. A second photoresist mask (not shown) is then formed on the upper surface of the material stack and lithography and etching are employed in forming second opening 48 in the material stack that stops on silicon layer 24 of the backgate region. Note that this etching steps also serves to over etch the oxide and nitride beyond the channel end.

Etch stop layer 50 which is typically formed of an oxide is then thermally grown in the second opening so as to cover the exposed surface of silicon. Etch stop layer 50 employed in the present invention typically has a thickness of from about 2 to about 10 nm. Next, a layer of amorphous-Si is deposited and etched so as to form dummy source/drain regions 52 on the sidewalls of the material stack. Conventional deposition processes and etching are employed in forming the dummy source/drain regions. The resultant structure obtained from these steps is illustrated in FIGS. 8A–D.

Next, a third photoresist mask (not shown in the drawings) is formed on the structure so as to protect the sidewalls provided in FIGS. 8A–D. Amorphous-Si which is present in the gate trench outside the FET active area is then etched utilizing a conventional etching process and a conventional oxygen implant is performed so as to form oxidized channel ends 54. The oxygen implant is carried out using an oxygen dopant concentration of from about 1E20 to about 1E21 atoms/cm$^3$. It is noted that this implant step provides channel ends 54 with oxygen so that the channel ends provide isolation. The resultant structure is shown in FIGS. 9A–D.

FIGS. 10A–D show the structure that is obtained after a dummy gate region 56 is deposited and planarized down to planarization stop layer 44. The dummy gate region, which may be composed of an oxide, is formed by a conventional deposition process such as CVD and the planarization process may include CMP or another conventional planarization technique.

Figure 11:
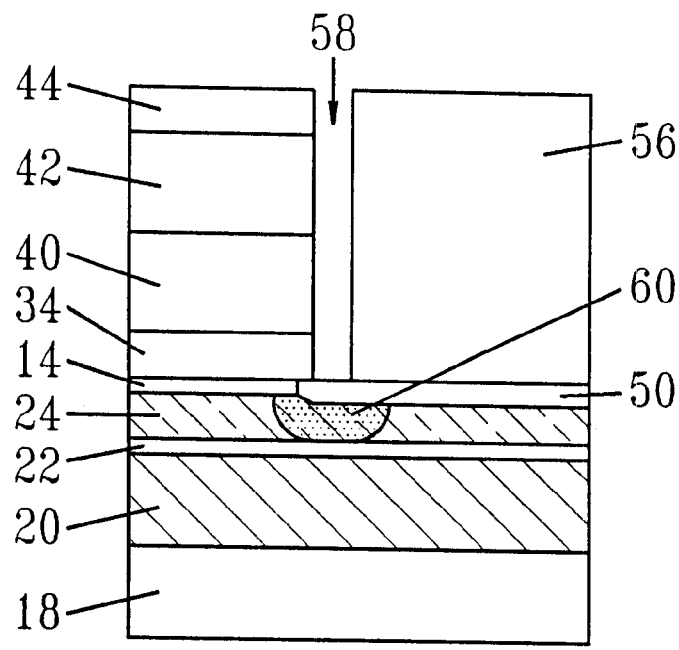

Next, a wet etch process which has a high selectivity for removing the dummy source/drain regions is employed so as to form slot 58 in the structure, See FIG. 11 which is a cut through cross section B–B'. Any conventional etchant such as KOH may be employed which is capable of selectively removing the amorphous-Si. Note that slot 58 is formed between the dummy gate region and the material stack. An optional implant may now be performed through the slot so as to form source/drain extension regions 60 in the structure.

Figure 12:
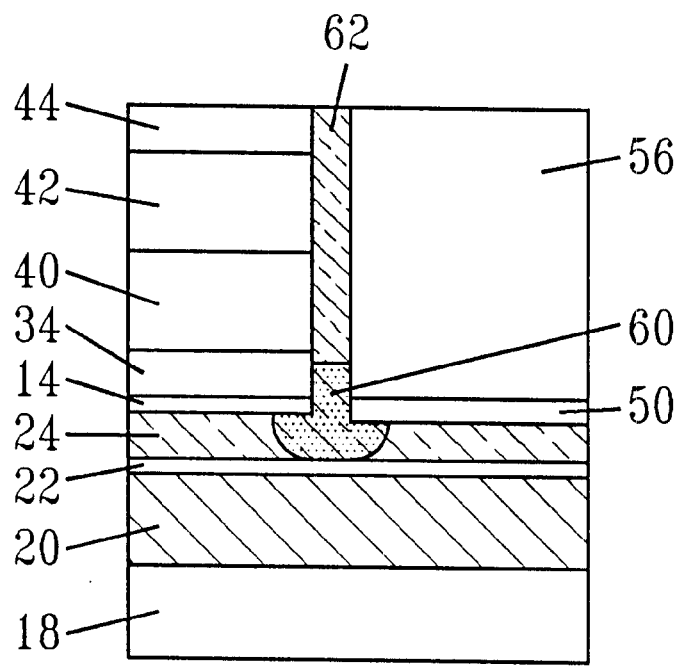
Figure 13A:
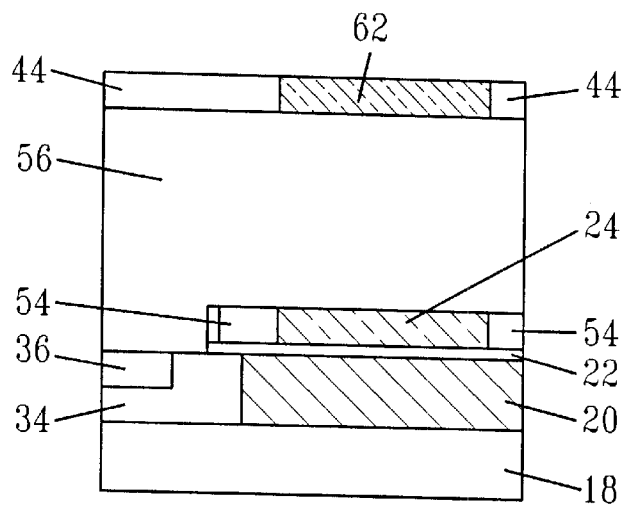
Figure 13B:
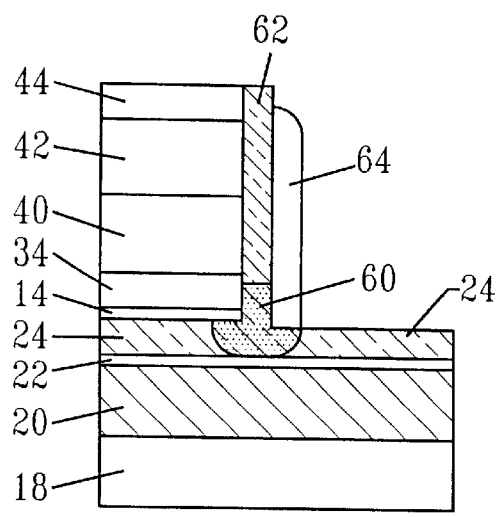
Figure 13C:
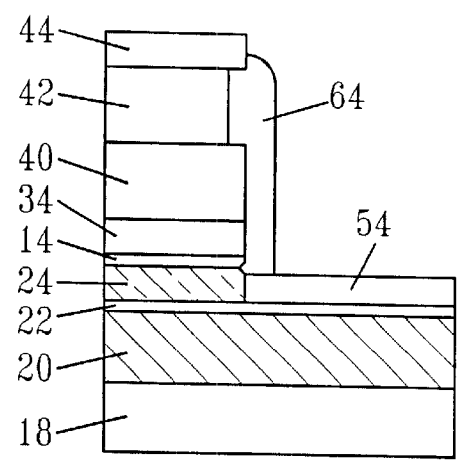
Figure 13D:
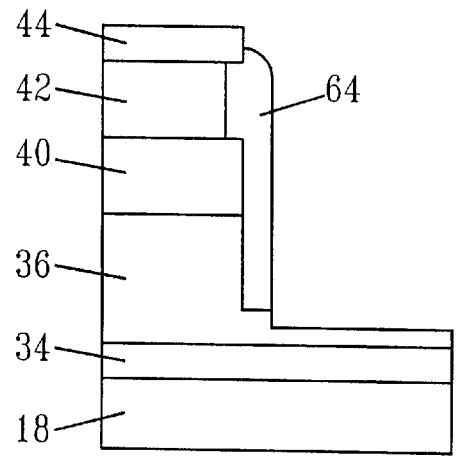
Figure 14A:
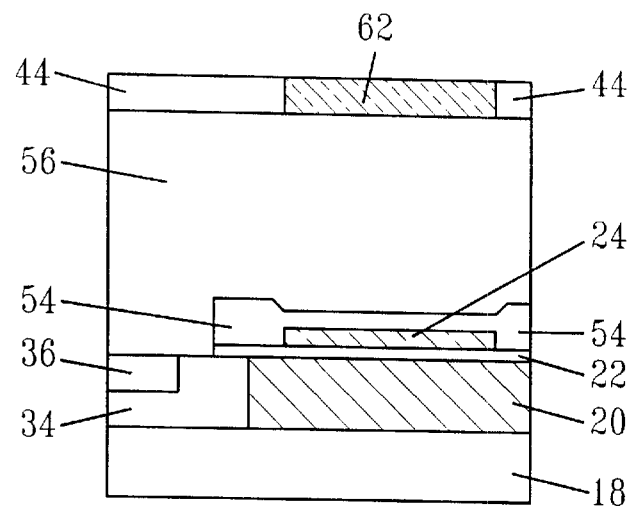
Figure 14B:
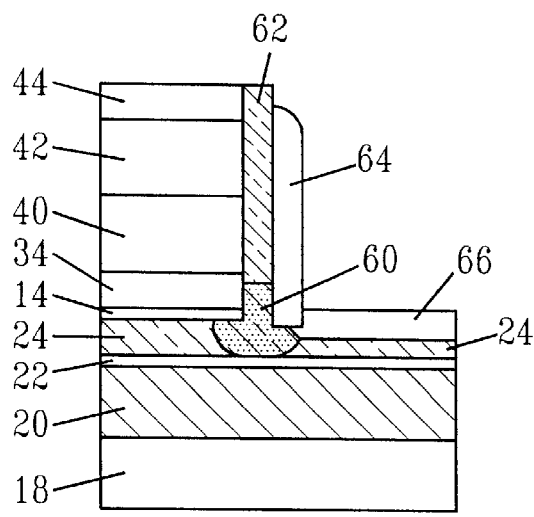
Figure 14C:
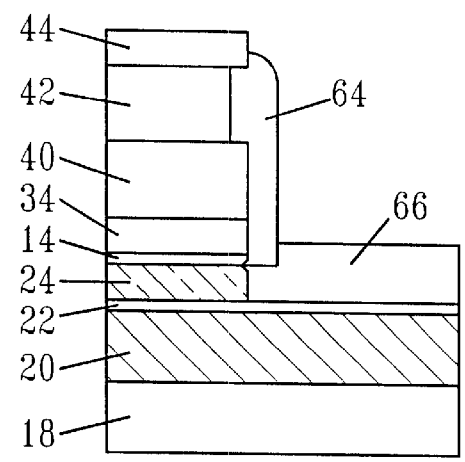
Figure 14D:
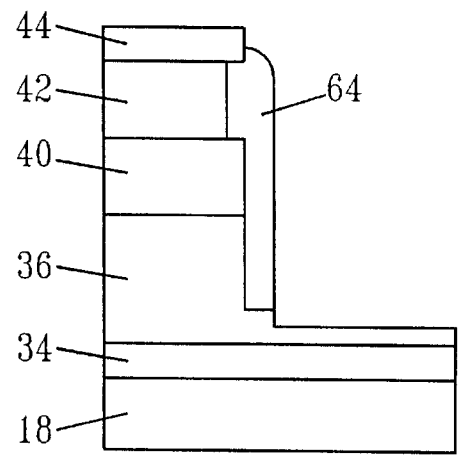
Figure 15A:
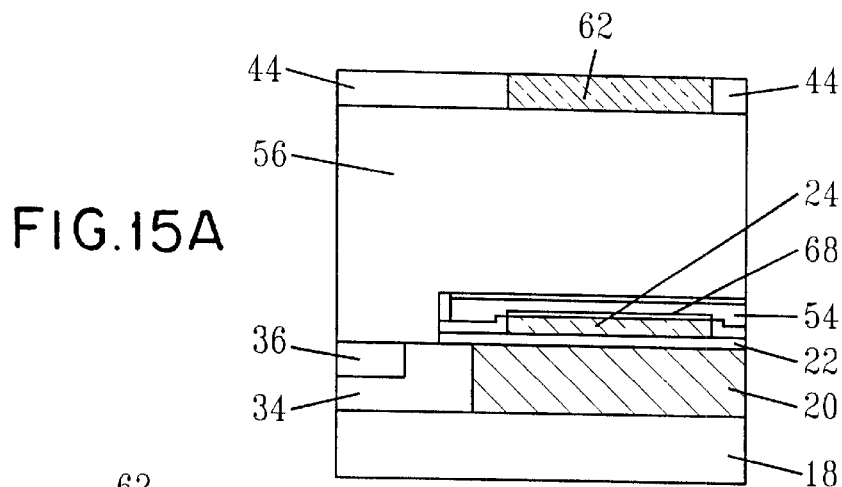
Figure 15B:
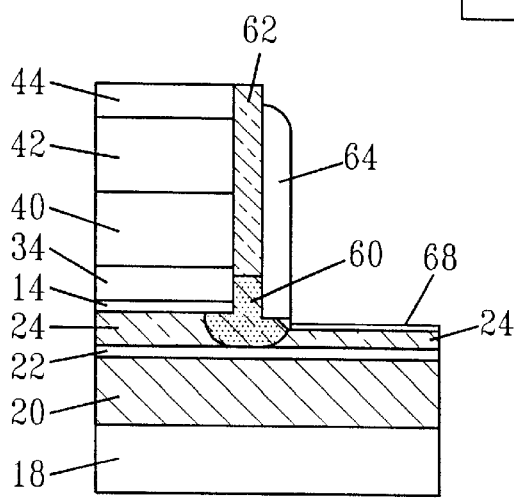
Figure 15C:
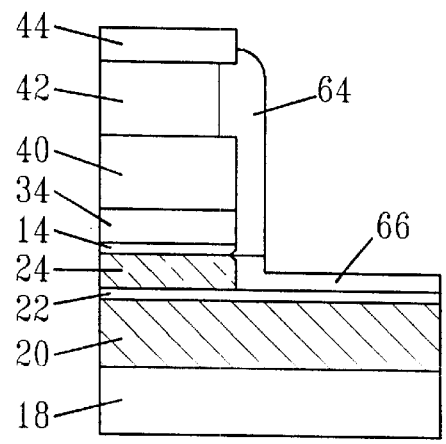
Figure 15D:
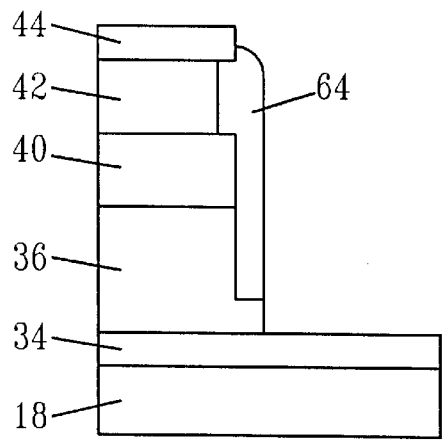
Figure 16:
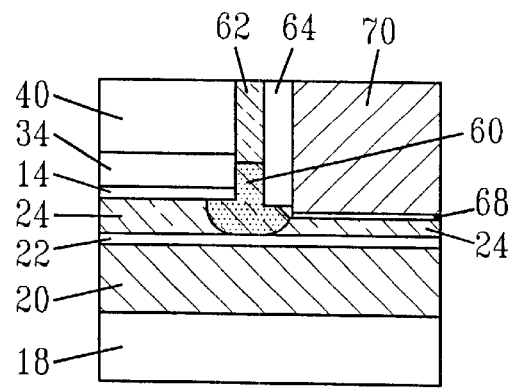
Figure 17A:
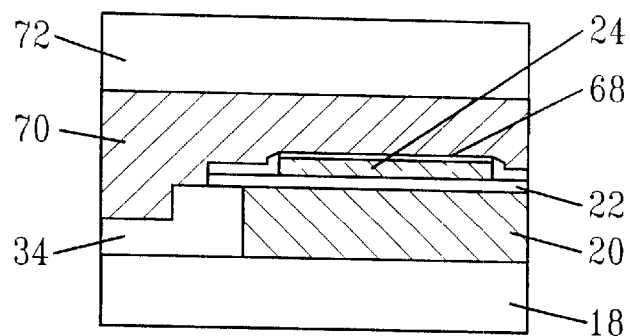
Figure 17B:
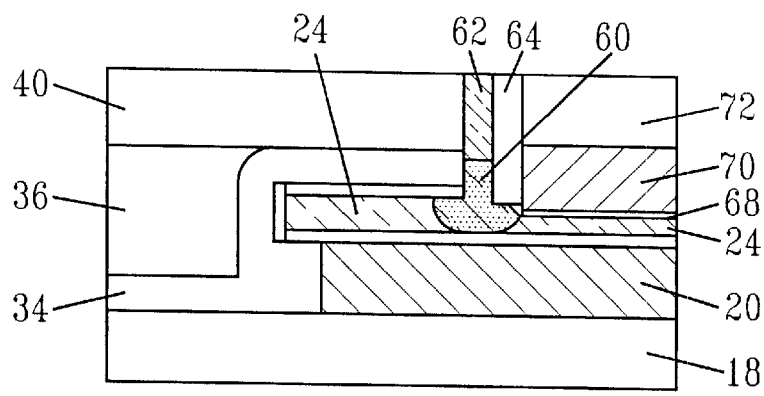
Figure 17C:
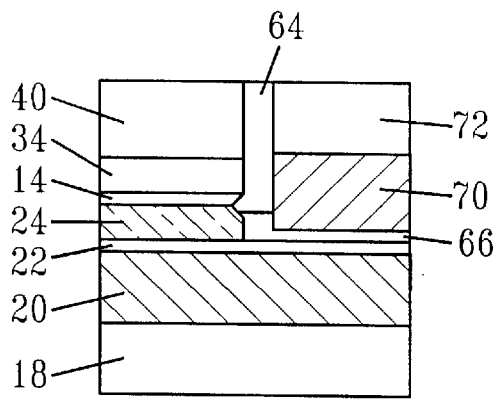
Figure 17D:
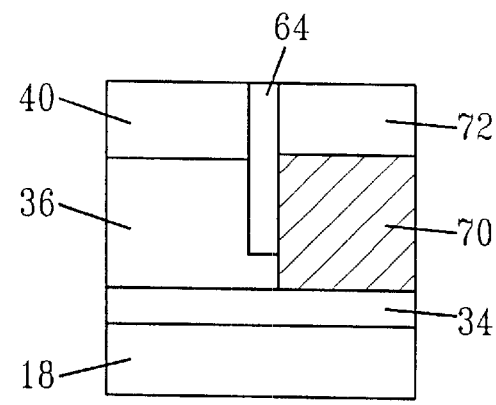
Figure 18:
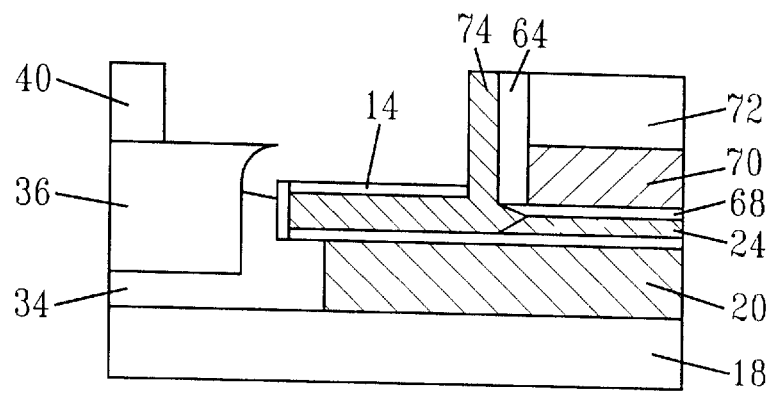
Figure 19:
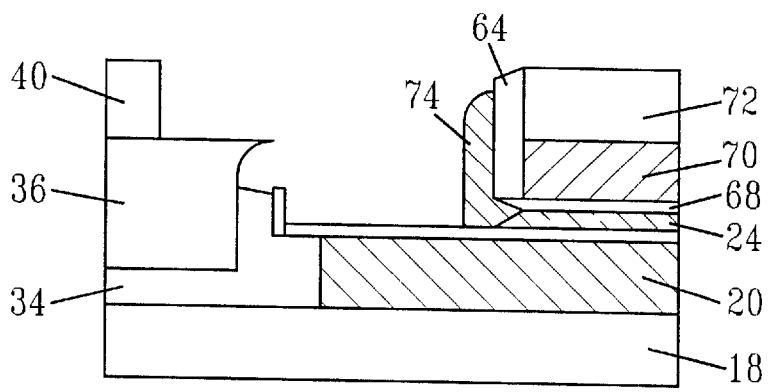
Figure 20:
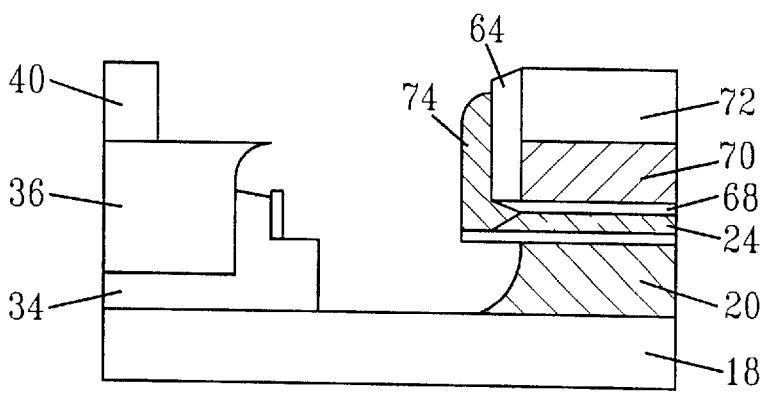

FIG. 12 which is a cut through B–B' shows the resultant structure that is obtained after planarizing down to planarization stop layer 44, depositing sidewall source/drain regions 62 and annealing for solid state epi regrowth. Specifically, the second sacrificial spacers are removed in the present invention by polishing and the sidewall source/drain regions are formed by epitaxially growing amorphous-Si utilizing conventional processes well known to those skilled in the art. The annealing step is carried out utilizing conditions which are sufficient for solid state epi-regrowth. Although various annealing temperatures and times may be employed for this regrowth, the present invention typically conducts this annealing step at a temperature of from about 100° to about 250° C. for a time period of from about 5 to about 30 minutes.

Following the annealing step, etch stop layer 50 and dummy gate region 56 are removed utilizing a conventional etching process which is highly selectivity for removing oxide. Gate spacers 64 which are composed of an oxide are thereafter formed by deposition and etching. Note that the etching process used in forming the gate spacers stops on silicon layer 24. The resultant structure which includes gate spacers 64 formed on Si layer 24 is shown in FIGS. 13A–D.

Oxide 66, which serves as a channel recess and isolation means, is then grown on the structure shown in FIGS. 13A–D. It is noted that oxygen implanted channel ends 54 will grow thicker oxides cutting through channel Si layer 24. The structure, which is obtained after forming oxide 66, is shown in FIGS. 14A–D.

After forming the structure shown in FIGS. 14A–D, oxide 66 is subjected to a conventional directional etching process. This etching step will consume field oxide 36 and stop on the first planarization stop layer beyond the channel ends, See FIG. 14D.

A top gate dielectric 68 such as an oxide, oxynitride, nitride or any combination thereof including multilayers is then formed by utilizing a conventional thermal growing process; See, FIGS. 15A–D. Top gate electrode 70, which maybe composed of the same or different conductive metal as the bottom gate electrode, is then formed on the top gate dielectric utilizing one of the previously mentioned deposition processes used in forming the bottom gate electrode. The deposited top gate electrode is then planarized by CMP down to second planarization stop layer 40; See FIG. 16 (cut through B–B').

FIGS. 17A–D show the structure that is formed after recess-etching the top gate electrode, depositing top gate protect layer 72, and planarizing top gate protect layer 72 down to second planarization stop layer 40. All three of these steps include conventional processes that are well known to those skilled in the art. Insofar as the top gate protect layer is concerned, that layer is typically composed of an oxide and it typically has a thickness of from about 20 to about 100 nm.

Next, a fourth photoresist and lithography step (not shown in the drawings) is used in forming source and drain well implants 74 in the structure. Specifically, first and second etch stop layers are etched down to pad oxide 14 and a conventional ion implantation process is thereafter performed so as to form source/drain well implants 74 in the etched regions, See FIG. 18 (view through B–B'). Pad oxide layer 14 and a portion of silicon layer 24 are then removed by a conventional etching process so as to form the structure shown in FIG. 19 (view through B–B'). Next, bottom gate dielectric 22 is subjected to a conventional RIE process and bottom gate electrode 20 is wet etched so as to provide the structure shown in FIG. 20 (view through B–B').

Figure 21:
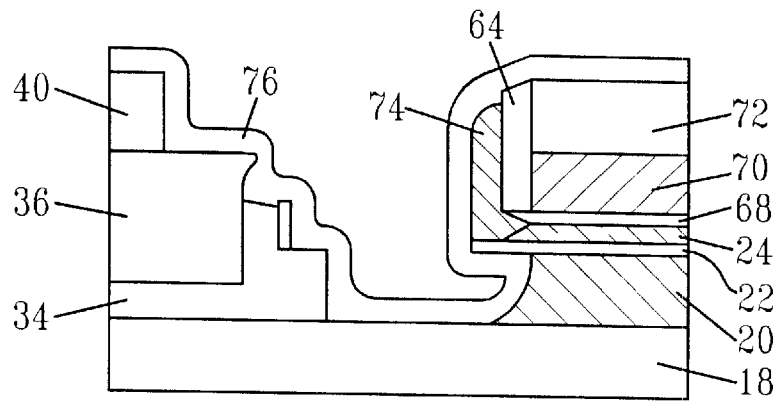

FIG. 21 shows the structure that is obtained after bottom gate protect layer 76 which is composed of a nitride is deposited and source/drain regions 62 are activated by a conventional activation annealing process. The activation annealing process is typically carried out at a temperature of from about 1000° to about 1100° C. for a time period of from about 1 to about 5 seconds.

Figure 22:
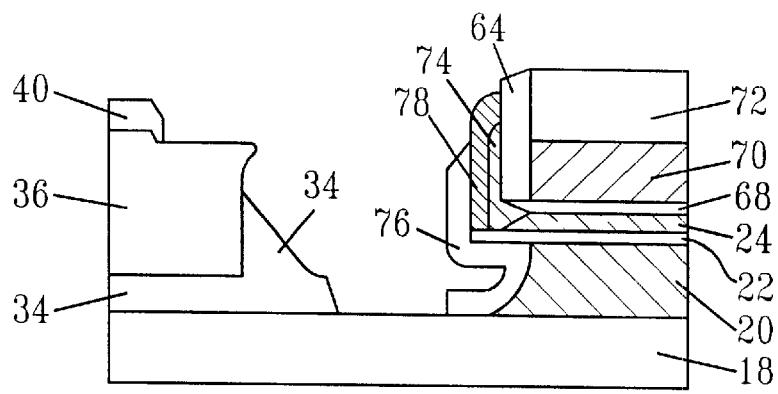

Next, backgate protect layer 76 is etched with directional RIE to expose portions of the source/drain implant regions, and self-aligned silicide regions 78 are formed in the structure utilizing conventional silicidation processing steps that are well known to those skilled in the art so as to form the structure illustrated in FIG. 22 (view through B–B').

Figure 23:
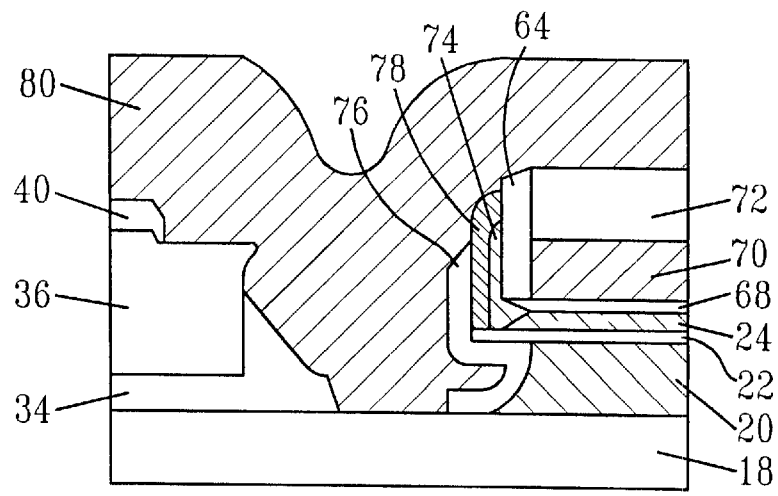
Figure 24A:
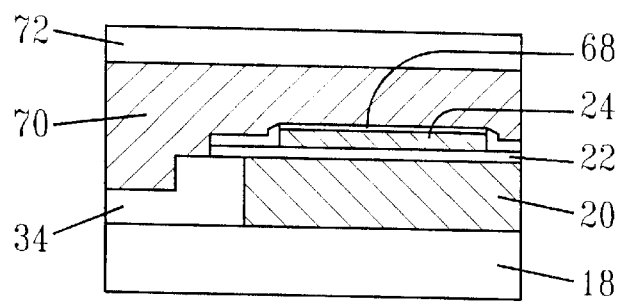
Figure 24B:
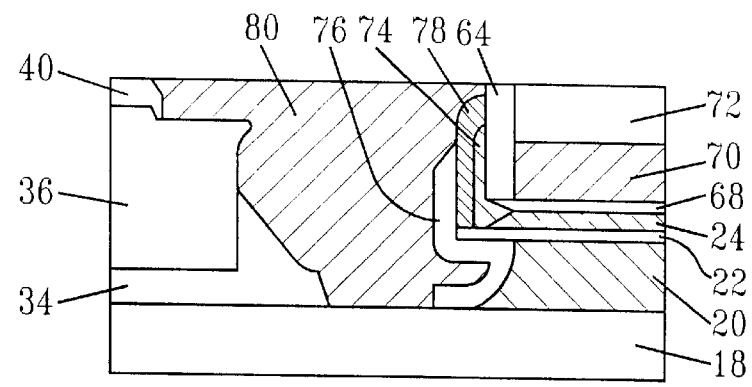
Figure 24C:
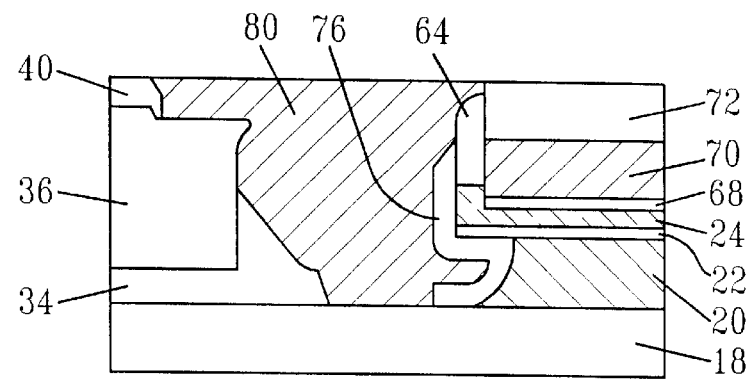
Figure 24D:
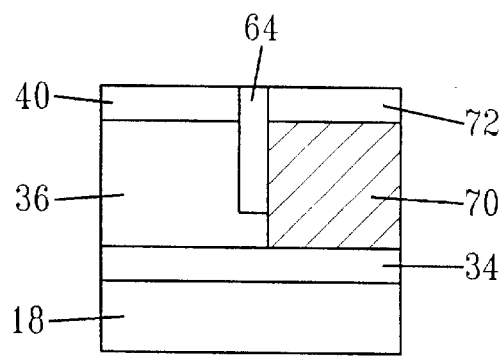

FIG. 23 (view through B–B') shows the structure after source/drain contact plugs 80 are formed. Specifically, the source/drain contact plugs are formed by depositing a refractory metal such as tungsten utilizing a conventional deposition process. Next, and as shown in FIGS. 24A–D, the structure is subjected to a conventional planarization process such as CMP.

The process flow described above, together with the listed materials represent a preferred embodiment of the present invention. In principle, other materials may be substituted which serve the same purpose, and other details of the process may change accordingly. It is noted however that any changes made to the above description must be capable of building the top gate inside a trench such that sidewall source/drain regions and oxide spacers are formed prior to formation of the gate. As indicated previous herein, the inventive process achieves the following advantages: (i) The inside-out geometry enable one to form a tapered body region with a thicker body under the contacts to reduce access resistance; (ii) since lithography defines the largest dimensions, the top gate length may be much smaller than the minimum lithographic feature; (iii) the bottom gate is referenced to the lithographic top gate stencil, resulting in better line width control; and (iv) allows the formation of double-gate field effect transistor having inverted geometry with the tapered sides facing the gate.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A double-gated FET structure comprising:

a top gate and a bottom gate which are separated by two gate dielectric layers which are sandwiched between a device channel region, said top and bottom gates are self-aligned with each other;

sidewall source and drain regions that are located in regions that are adjacent and between said top and bottom gates;

silicide gate contacts which are in electrical contact with said top and bottom gates and are located adjacent to said source and drain regions; and source and drain wells that are located in regions abutting the silicide gate contacts.

2. The double-gated FET structure of claim 1 wherein said top and bottom gates are composed of the same or different refractory metal.

3. The double-gated FET structure of claim 1 wherein said top and bottom gates are both composed of tungsten.

4. The double-gated FET structure of claim 1 wherein either of said top and bottom gates are both composed of silicon.

5. The double-gated FET structure of claim 1 where said device channel is a silicon layer whose ends have been passivated.

6. The double-gated FET structure of claim 1 wherein two gate dielectrics are both composed of an oxide.

7. The double-gated FET structure of claim 1 wherein either of said two gate dielectrics are composed of an oxynitride.

8. The double-gated FET structure of claim 1 wherein either of said two gate dielectrics are composed of an oxide-nitride stack.

9. The double-gated FET structure of claim 1 wherein said sidewall source and drain regions are composed of amorphous Si.

10. The double-gated FET structure of claim 1 further comprising source/drain contacts in contact with said source/drain regions.

* * * * *